(12) United States Patent
Kimoto

(10) Patent No.: US 11,114,985 B2
(45) Date of Patent: Sep. 7, 2021

(54) HIGH FREQUENCY AMPLIFIER

(71) Applicant: SUMITOMO ELECTRIC DEVICE INNOVATIONS, INC., Kanagawa (JP)

(72) Inventor: Yuji Kimoto, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 16/844,722

(22) Filed: Apr. 9, 2020

(65) Prior Publication Data
US 2020/0328722 A1    Oct. 15, 2020

(30) Foreign Application Priority Data
Apr. 15, 2019    (JP) .............................. JP2019-077053

(51) Int. Cl.
| H03F 3/191 | (2006.01) |
| H03F 1/56 | (2006.01) |
| H03F 3/24 | (2006.01) |
| H03F 3/195 | (2006.01) |

(52) U.S. Cl.
CPC ............... *H03F 1/56* (2013.01); *H03F 3/195* (2013.01); *H03F 3/245* (2013.01); *H03F 2200/255* (2013.01); *H03F 2200/318* (2013.01)

(58) Field of Classification Search
CPC ...................................................... H03F 3/191
USPC .................................................. 330/302, 305
See application file for complete search history.

(56) References Cited

U.S. PATENT DOCUMENTS

| 7,616,060 B2 * | 11/2009 | Yamamoto ........... H03G 1/0052 |
| | | 330/284 |
| 2009/0309655 A1 * | 12/2009 | Yamamoto ............ H03F 1/0261 |
| | | 330/51 |

FOREIGN PATENT DOCUMENTS

| JP | 2005-204208 | 7/2005 |
| WO | 2017-122271 | 7/2017 |

* cited by examiner

*Primary Examiner* — Henry Choe
(74) *Attorney, Agent, or Firm* — Smith, Gambrell & Russell, LLP.

(57) ABSTRACT

A high frequency amplifier 1 includes an input terminal $P_{IN}$, an output terminal $P_{OUT}$, a transistor 5 configured to amplify an RF signal applied to the input terminal $P_{IN}$, a matching circuit 9 for a fundamental of the RF signal and a reflection circuit 7 for a harmonic relative to the fundamental, the matching circuit 9 and the reflection circuit 7 being connected in series between the transistor 5 and the output terminal $P_{OUT}$, an extraction circuit 13 configured to extract a harmonic appearing at the output terminal $P_{OUT}$, processing circuits 15, 17 configured to adjust a phase and intensity of the harmonic extracted by the extraction circuit 13, and a multiplexing circuit 19 configured to multiplex the harmonic processed by the processing circuits 15, 17 to the harmonic reflected by the reflection circuit 7 and give the multiplexed harmonic to the transistor 5.

7 Claims, 3 Drawing Sheets

HIGH FREQUENCY AMPLIFIER

TECHNICAL FIELD

The present disclosure relates to a high frequency amplifier that amplifies a high frequency signal.

BACKGROUND

Conventional high frequency amplifiers that amplify high frequency waves such as microwaves have been put to various uses such as radio communication and radar. Examples of such high frequency amplifiers include a class F amplifier and an inverted class F amplifier capable of highly efficient operation to suppress power loss. For example, an amplifier disclosed in Japanese Unexamined Patent Publication No. 2005-204208 includes an odd harmonic signal generation circuit that generates an odd harmonic signal relative to a fundamental signal to be amplified, and a rectangular wave signal generation circuit that multiplexes the odd harmonic signal to the fundamental signal. Further, an amplifier disclosed in WO 2017/122271 A includes a harmonic supply circuit that supplies a harmonic contained in an RF signal amplified by a first transistor to a second transistor, and a fundamental supply circuit that supplies a fundamental contained in the RF signal to the second transistor.

However, the structure disclosed in Japanese Unexamined Patent Publication No. 2005-204208 described above requires a signal source that generates a harmonic signal, which leads to an increase in power consumption. Further, with the structure disclosed in WO 2017/122271 A described above, a harmonic is attenuated toward an end face of an intrinsic transistor due to a parasitic component on an output side of the transistor, and the impedance for the harmonic at the end face of the intrinsic transistor fails to be set to a true optimum impedance, which makes it impossible to sufficiently improve the power efficiency of the whole amplifier only by matching using a passive element. The present disclosure provides a high frequency amplifier capable of sufficiently improving power efficiency.

SUMMARY

A high frequency amplifier according to an aspect of the present disclosure includes an input terminal, an output terminal, a transistor configured to amplify an input high frequency signal applied to the input terminal, a matching circuit for a fundamental of the input high frequency signal and a reflection circuit for a harmonic relative to the fundamental, the matching circuit and the reflection circuit being connected in series between the transistor and the output terminal, an extraction circuit configured to extract a harmonic appearing at the output terminal, a processing circuit configured to adjust a phase and intensity of the harmonic extracted by the extraction circuit, and a multiplexing circuit configured to multiplex the harmonic processed by the processing circuit to the harmonic reflected by the reflection circuit and give the multiplexed harmonic to the transistor.

DETAILED DESCRIPTION

Figure 1:
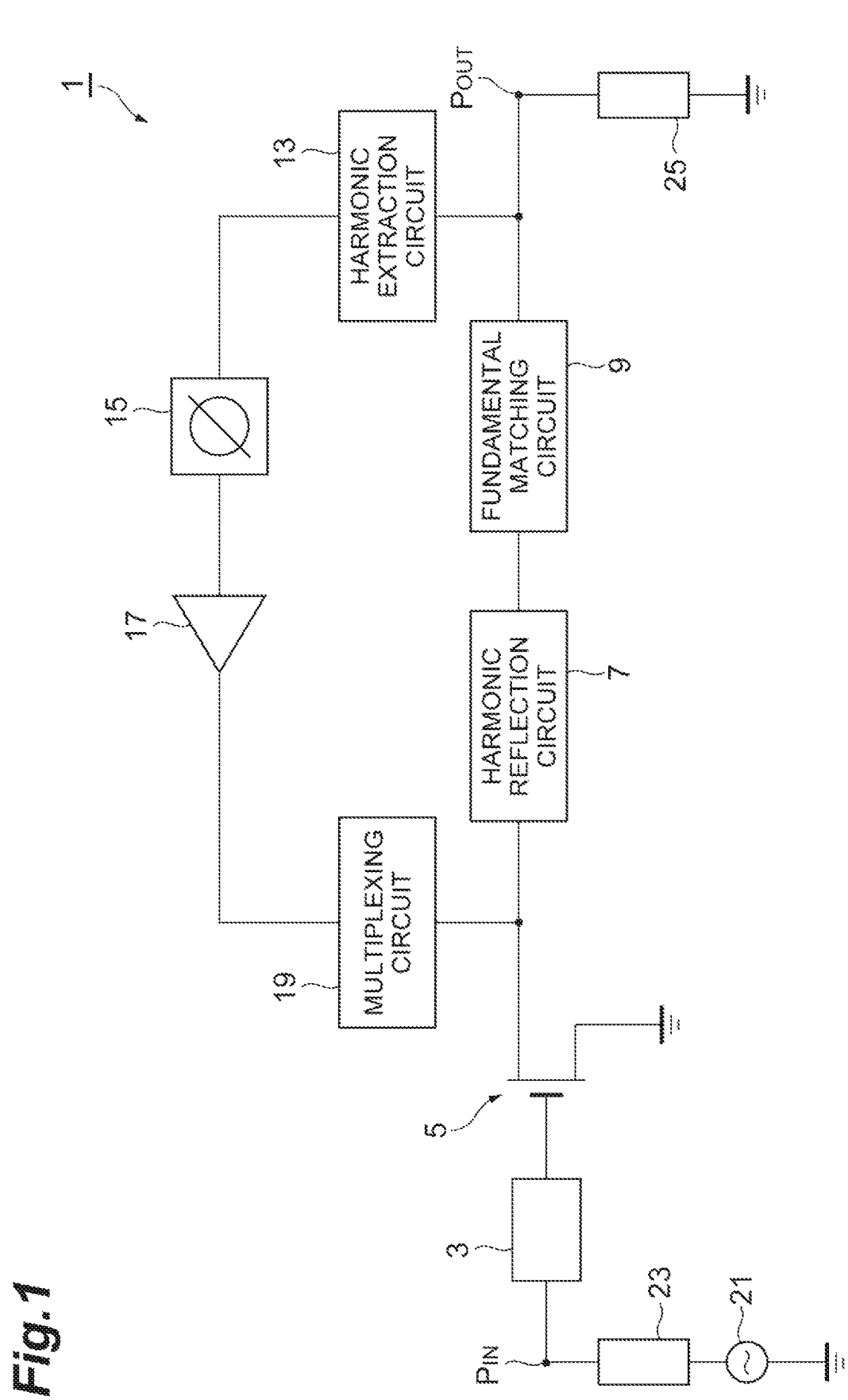
FIG. 1 is a block diagram showing a schematic structure of a high frequency amplifier according to an embodiment.

A description will be given below of an embodiment of the present disclosure with reference to the drawings. Note that, in a description of the drawings, the same components are denoted by the same reference numerals, and a redundant description will be omitted.

[Structure of High Frequency Amplifier]

FIG. 1 is a block diagram showing a structure of a high frequency amplifier 1 according to an embodiment. The high frequency amplifier 1 is used for, for example, radio communication or radar to amplify a high frequency signal. As shown in FIG. 1, the high frequency amplifier 1 includes an input terminal $P_{IN}$, an output terminal $P_{OUT}$, an input matching circuit 3, a transistor 5, a harmonic reflection circuit 7, a fundamental matching circuit 9, a harmonic extraction circuit 13, and a phase shifter 15, an amplifier 17, and a multiplexing circuit 19. The input terminal $P_{IN}$ receives a high frequency signal (RF signal) from a high frequency signal source 21 via a transmission line 23 having a characteristic impedance $Z_0$. On the other hand, the output terminal $P_{OUT}$ is connected to a load 25 having a characteristic impedance $Z_0$. The harmonic reflection circuit 7, the fundamental matching circuit 9, and the harmonic extraction circuit 13 are connected in series between the input terminal $P_{IN}$ and the output terminal $P_{OUT}$.

The input matching circuit 3 matches an input impedance of the transistor 5 to the characteristic impedance of the transmission line 23. Specifically, the input matching circuit 3 matches an impedance when viewing the transistor 5 from a control terminal (gate terminal) of the transistor 5 to the characteristic impedance of the transmission line 23 when viewing the transistor from a terminal of the input matching circuit 3 connected to the transmission line 23.

The transistor 5 is, for example, a field-effect transistor (FET) that amplifies the RF signal. The following description will be given with an FET used as the transistor, but the same description applies to a bipolar transistor. The RF signal is input to a gate serving as input of the transistor 5 via the transmission line 23 and the input matching circuit 3. The transistor 5 has a source grounded and has a drain connected to the output terminal $P_{OUT}$ via the harmonic reflection circuit 7 and the fundamental matching circuit 9.

The harmonic reflection circuit 7 and the fundamental matching circuit 9 are each formed of a transmission line and have a particular impedance and a particular length. The harmonic reflection circuit 7 transmits a fundamental component contained in output of the transistor 5 and reflects a harmonic component toward the transistor 5. The fundamental matching circuit 9 matches an impedance when viewing the output terminal $P_{OUT}$ from an end face of the drain of the transistor 5 to an optimum load impedance that allows design parameters such as output power and power-added efficiency of the transistor 5 to be optimized.

In general, the RF signal input from the input terminal $P_{IN}$ contains not only a fundamental but also a harmonic component. Further, the input and output characteristics of the transistor 5 are nonlinear, and even when an RF signal containing no distortion (no harmonic component) is input, a significant harmonic component appears in a signal that results from amplifying the RF signal. The harmonic reflection circuit 7 reflects this harmonic component toward the transistor 5 and exclusively transmits the fundamental. The fundamental matching circuit 9 performs impedance matching to the optimum load impedance on the fundamental thus transmitted.

The harmonic extraction circuit 13 extracts the harmonic component that has passed through the fundamental matching circuit 9 and appears at the output terminal $P_{OUT}$. The harmonic reflection circuit 7 reflects most of the harmonic component appearing at the output of the transistor 5; however, it is impossible in principle to make the transmission amount zero. Further, the fundamental matching circuit 9 exclusively transmits the fundamental and also reflects or absorbs the harmonic component other than the fundamental; however, it is impossible to make the harmonic component at the output of the fundamental matching circuit 9 zero. A small but significant harmonic component appears at the output terminal $P_{OUT}$. The harmonic extraction circuit 13 extracts the harmonic component appearing at the output terminal $P_{OUT}$, causes the phase shifter (processing circuit) 15 to adjust a phase of the harmonic component by rotating the phase, and causes the amplifier (processing circuit) 17 to adjust intensity of the harmonic component by amplifying or attenuating the harmonic component. Then, the harmonic component processed as described above is multiplexed, by the multiplexing circuit 19 for the harmonic, to the harmonic reflected by the harmonic reflection circuit 7, and the multiplexed harmonic is given to the drain of the transistor 5.

As described above, the output signal of the transistor 5 always contains such a harmonic component. When the harmonic component is given to the load 25 via an external circuit such as an output transmission line, extra power is consumed in a drain resistance of the transistor 5 or the external circuit. Therefore, it is preferable that reflection intensity for the harmonic be set higher when viewing the load 25 from the drain output of the transistor 5. This is equivalent to a situation where no harmonic component is output to the external circuit. Further, reflecting the harmonic to cause waveform shaping at the end face of the drain of the transistor 5 makes it possible to suppress power loss.

However, a conventional output matching circuit including only the fundamental matching circuit cannot sufficiently increase the reflection intensity for the harmonic component. Even when the optimum matching to the fundamental is made, the optimum reflection condition is not necessarily imparted for the harmonic component. Further, a structure where the harmonic reflection circuit and the fundamental matching circuit are connected in series may cause the harmonic reflection circuit to shift a matching condition for the fundamental from the optimum value. One of the harmonic reflection circuit and the fundamental matching circuit may become an element that deteriorates the optimum condition for the other.

Further, the transistor 5 generally includes an element portion (a portion included in a semiconductor element) and a portion (a bonding wire, a bonding pad, a lead terminal, or the like) that is a part of the element portion extending outward and connects the element portion to the external circuit. For the element portion, even when the matching condition and the reflection condition are satisfied for both the fundamental and the harmonic, the use of a circuit formed as an actual device including a bonding wire, a bonding pad, a lead terminal, or the like makes it difficult to obtain a satisfactory combination of the matching condition and the reflection condition.

According to the present embodiment, a structure is provided where the harmonic component appearing at the output terminal $P_{OUT}$ is amplified or attenuated and then given to the drain output of the transistor 5, so that the harmonic reflection intensity of the transistor 5 is increased, and the fundamental component appearing at the output terminal $P_{OUT}$ is increased.

A description will be given of a specific circuit structure of the high frequency amplifier 1 with reference to FIG. 2.

Figure 2:
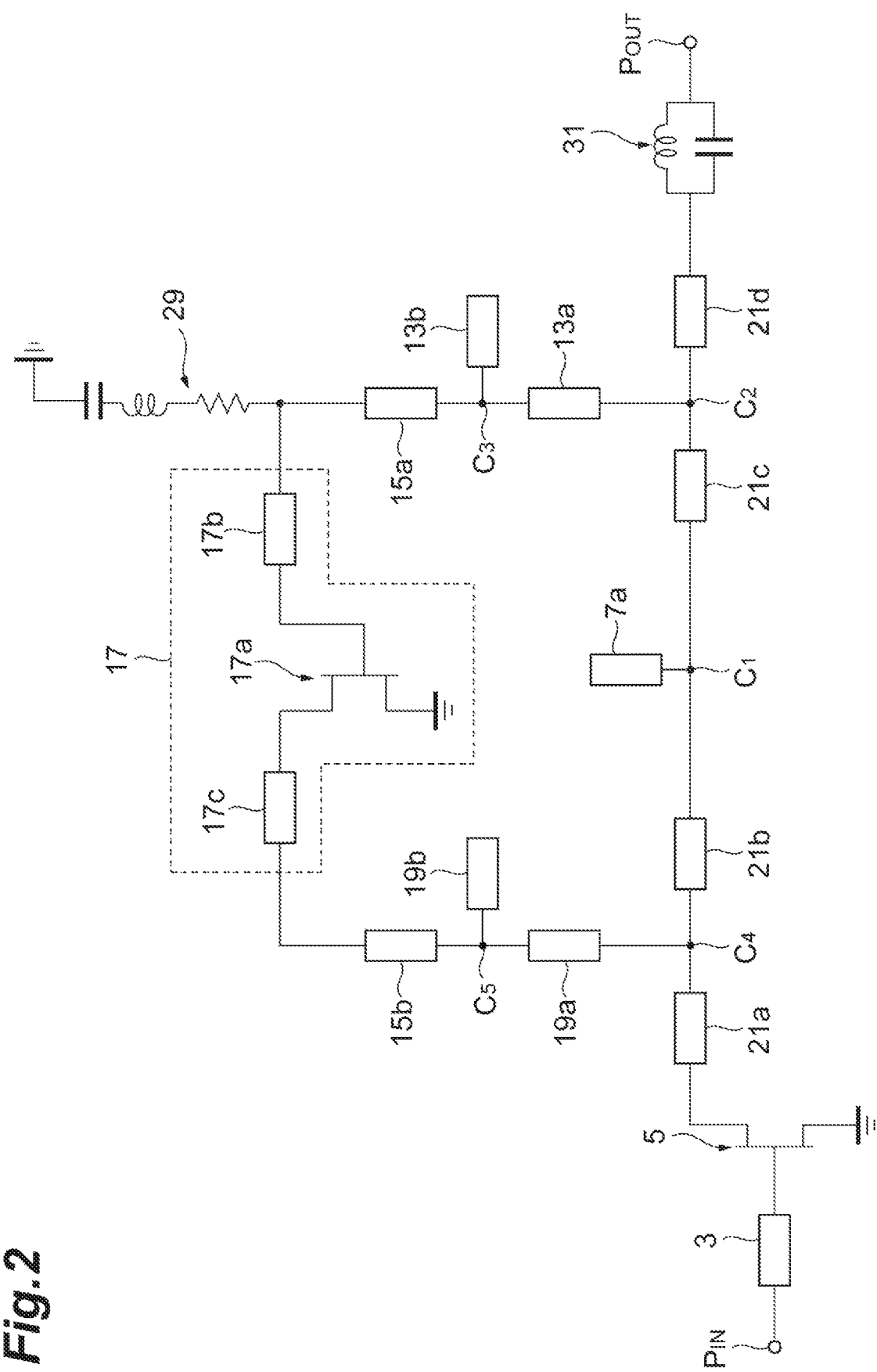
FIG. 2 is a circuit diagram showing the structure of the high frequency amplifier shown in FIG. 1.

As shown in FIG. 2, the high frequency amplifier 1 includes a main transmission line that includes transmission lines 21a to 21d and a planar waveguide 31 represented by a parallel circuit of an inductor and a capacitor and connects between the transistor 5 and the output terminal $P_{OUT}$, and a sub-transmission line extending from a node $C_2$ of the main transmission line to a node $C_4$ of the main transmission line via a transistor 17a.

The harmonic reflection circuit 7 is connected to a node $C_1$ of the main transmission line located between the fundamental matching circuit 9 and the multiplexing circuit 19 and includes a transmission line 7a having a length equal to $\lambda/8$. Herein, $\lambda$ denotes the wavelength of the fundamental, and $\lambda/8$ is equal to one quarter of the wavelength of the second harmonic. The transmission line 7a has one end open; therefore, the node $C_1$ on the main transmission line can be regarded as being short-circuited for the second harmonic component and thus forms a reflection circuit for the second harmonic propagating through the main transmission line.

The harmonic extraction circuit 13 includes two transmission lines 13a, 13b having a length equal to $\lambda/4$ of the fundamental. The transmission line 13b has one end open and has the other end connected to one end of the transmission line 13a, and the transmission line 13a has the other end connected to the output terminal $P_{OUT}$ via the node $C_2$ on the main transmission line. As a result, a node $C_3$ located between the two transmission lines 13a, 13b on the sub-transmission line can be regarded as being short-circuited for the fundamental. On the other hand, the node $C_3$ is open to the second harmonic. Since the transmission line 13a has a length equal to $\lambda/4$ of the fundamental, the node $C_2$ connected to the other end of the transmission line 13a on the main transmission line is open to both the fundamental and the second harmonic.

The transmission line 13a and the two transmission lines 21c and 21d form the fundamental matching circuit 9. In particular, since the transmission line 7a that forms the reflection circuit for the second harmonic is interposed with the main transmission line, it is required that the characteristic impedance of the main transmission line disturbed by the transmission line 7a be matched for the fundamental on a downstream side of the main transmission line from the transmission line 7a. Since both the transmission lines 13a, 13b have a length equal to one half of the wavelength of the second harmonic, the transmission lines 13a, 21c, 21d forming the fundamental matching circuit 9 do not affect the second harmonic. As a result, some of the second harmonic leaked without being reflected by the transmission line 7a flows from the node $C_2$ into the sub-transmission line.

The second harmonic flowing into the sub-transmission line through the node $C_3$ reaches, via transmission lines 15a, 17b, the transistor 17a by which the second harmonic is amplified or attenuated, and then reaches the multiplexing circuit 19 via transmission lines 17c, 15b. The transistor 17a is identical in type and size to the transistor 5. The transmission lines 15*a*, 15*b* form the phase shifter 15 that shifts the phase of the second harmonic flowing into the sub-transmission line. Further, the transmission line 15*a* has one end connected to a filter circuit 29 including a resistor, an inductor, and a capacitor. This filter circuit 29 is interposed between the harmonic extraction circuit 13 and the transistor 17*a* to remove the fundamental component flowing into the sub-transmission line to prevent the transistor 17*a* from being affected by the fundamental component. In general, the fundamental component is overwhelmingly larger in magnitude than the second harmonic component. Although the transmission lines 21*c*, 21*d*, 13*a* forming the fundamental matching circuit 9 suppresses the inflow of the fundamental into the sub-transmission line, the filter circuit 29 prevents the fundamental component flowing into the sub-transmission line from reaching the transistor 17*a*. For this reason, it is desirable that the filter circuit 29 have a filter structure having excellent frequency cutoff characteristics. The transmission line 17*c* has the other end connected to one end of the transmission line 15*b* forming the phase shifter 15.

The multiplexing circuit 19 includes two transmission lines 19*a*, 19*b* each having a length equal to $\lambda/4$ of the fundamental. That is, the transmission lines 19*a*, 19*b* have a length equal to one half of the wavelength of the second harmonic. The transmission line 19*b* has one end open and has the other end connected to one end of the transmission line 19*a*. The transmission line 19*a* has the other end connected to the node $C_4$ located between the transistor 5 and the transmission line 7*a* on the main transmission line. Since the one end of the transmission line 19*b* is open, a node $C_5$ located between the two transmission lines 19*a*, 19*b* can be regarded as being short-circuited for the fundamental and being open to the second harmonic. As a result, the node $C_4$ on the main transmission line can be regarded as being open to both the fundamental and the second harmonic. That is, the multiplexing circuit 19 exhibits the same effects as the two transmission lines 13*a*, 13*b* included in the harmonic extraction circuit 13 exhibit. That is, the transmission lines 21*a*, 21*b* on the main transmission line and the transmission line 19*a* act as a matching circuit for the fundamental and do not have any effect on the second harmonic.

The high frequency amplifier 1 described above is capable of extracting the second harmonic from the output of the transistor 5 and feeding the second harmonic back to the drain of the transistor 5 after adjusting the amplitude and phase of the second harmonic. This makes it possible to make the intensity of the second harmonic higher at the drain of the transistor 5 and make the fundamental appearing at the output terminal $P_{OUT}$ relatively higher, which in turn makes it possible to improve the power efficiency of the high frequency amplifier 1 as a whole. More specifically, this makes it possible to make the reflection intensity for the second harmonic higher and reduce the heat loss due to the waveform shaping as compared to a structure where the harmonic processing circuit is formed only by a passive circuit, which in turn makes it possible to improve the power efficiency of the high frequency amplifier 1.

Figure 3A:
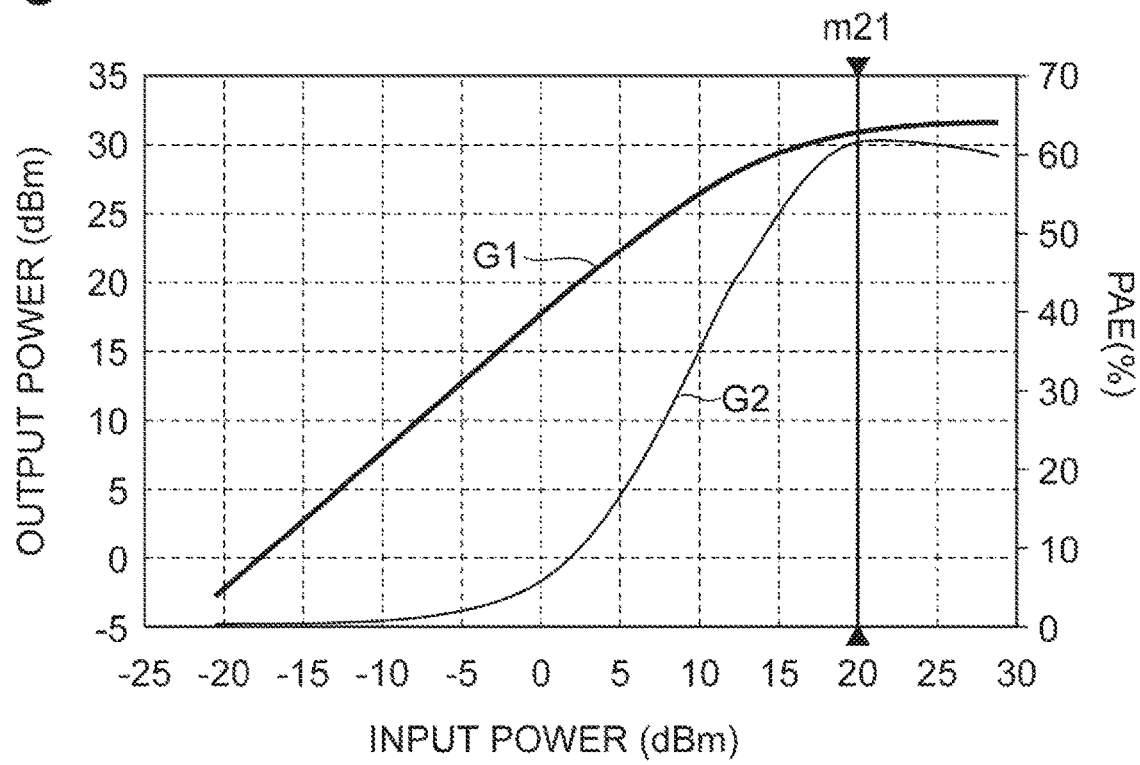
FIG. 3A is a graph showing output power and power-added efficiency (PAE) to input power when the high frequency amplifier does not multiplex a second harmonic.
Figure 3B:
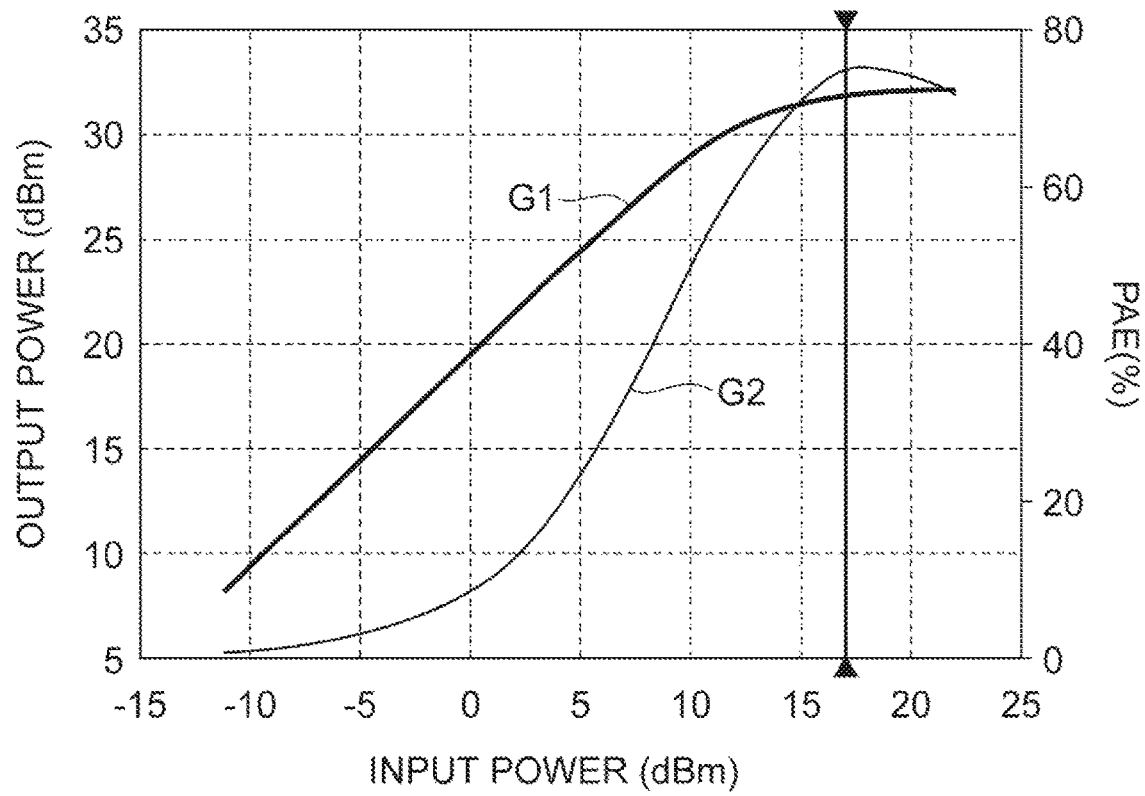
FIG. 3B is a graph showing output power and power-added efficiency (PAE) to input power when the high frequency amplifier multiplexes the second harmonic.

FIG. 3A and FIG. 3B show evaluation results of output power and power-added efficiency (PAE) to input power in high frequency amplifier 1. FIG. 3A is an evaluation result of output power and PAE when the second harmonic is not multiplexed in the present embodiment, and FIG. 3B is an evaluation result of output power and PAE when the second harmonic is multiplexed in the present embodiment. In each graph, a graph G1 represents changes in output power relative to input power, and a graph G2 represents PAE relative to input power. As shown in the graphs, although the output power when the input power is 20 dBm is approximately equal to 31 dBm in each graph, the maximum power-added efficiency is increased from the conventional efficiency of 62% to about 73% in the present embodiment including the multiplexing circuit for the second harmonic.

According to the present embodiment, returning the second harmonic to the drain of the transistor 5 makes it possible to equivalently amplify the second harmonic that is reflected by the harmonic reflection circuit 7 to return to the transistor 5, which in turn makes it possible to increase the efficiency for the fundamental. That is, in the high frequency amplifier 1, the harmonic reflected by the transmission line 7*a*, and the harmonic extracted and adjusted in amplitude and phase through the harmonic extraction circuit 13, the phase shifter 15, the amplifier 17, and the multiplexing circuit 19 are multiplexed to the output at the drain of the transistor 5. This makes it possible to sufficiently increase a voltage reflection coefficient $\Gamma$ for the harmonic at the end face of the intrinsic portion of the transistor 5.

Further, in the high frequency amplifier 1, the harmonic extraction circuit 13 includes the transmission lines 13*a*, 13*b*, and the multiplexing circuit 19 includes the transmission lines 19*a*, 19*b*. Such a structure allows the harmonic extraction circuit 13 and the multiplexing circuit 19 to extract and multiplex the harmonic to the output without affecting the propagation characteristics of the fundamental of the output of the transistor 5.

The high frequency amplifier 1 further includes the filter circuit 29. This makes it possible to efficiently extract the harmonic from the output of the transistor 5 and feed the harmonic back to the output.

Further, according to the present embodiment, the second harmonic corresponding to the second multiple of the frequency of the fundamental is extracted from the drain of the transistor 5 and fed back. Such a structure can efficiently generate a voltage signal converted to a pseudo rectangular wave at the drain of the transistor 5.

Further, according to the present embodiment, the amplifier 17 includes the transistor 17*a* identical in size to the transistor 5. Such a structure allows commonality of the design parameters for the two transistors.

Having described and illustrated the principles of the present invention according to the preferred embodiment, it is appreciated by those having skill in the art that the present invention can be modified in arrangement and detail without departing from such principles. The present invention is not limited to the specific structure disclosed according to the present embodiment. Therefore, all modifications and changes deriving from the scope and spirit of the claims are claimed.

According to the above-described embodiment, the second harmonic is extracted from the output of the transistor 5 by the harmonic extraction circuit 13, and the second harmonic thus extracted is multiplexed to the output of the transistor; however, the second harmonic may be any harmonic such as a third harmonic or a fourth harmonic. Further, another structure may be employed where a plurality of harmonic processing circuits such as the sub-transmission line according to the above-described embodiment are provided and each process a corresponding one of different harmonics. Even such a structure can sufficiently increase the voltage reflection coefficient $\Gamma$ for the harmonic at the end face of the intrinsic portion of the transistor 5 to increase the power efficiency.

What is claimed is:

1. A high frequency amplifier comprising:
an input terminal;
an output terminal;
a transistor configured to amplify an input high frequency signal applied to the input terminal;
a matching circuit for a fundamental of the input high frequency signal and a reflection circuit for a harmonic relative to the fundamental, the matching circuit and the reflection circuit being connected in series between the transistor and the output terminal;
an extraction circuit configured to extract a harmonic appearing at the output terminal;
a processing circuit configured to adjust a phase and intensity of the harmonic extracted by the extraction circuit; and
a multiplexing circuit configured to multiplex the harmonic processed by the processing circuit to the harmonic reflected by the reflection circuit and give the multiplexed harmonic to the transistor.

2. The high frequency amplifier according to claim 1, wherein
the harmonic is a second harmonic of the fundamental.

3. The high frequency amplifier according to claim 1, wherein
the reflection circuit is a transmission line having one end connected to a transmission line extending between the transistor and the matching circuit and having another end open, the reflection circuit having a length equal to one quarter of a wavelength of the harmonic.

4. The high frequency amplifier according to claim 1, wherein
the extraction circuit includes one transmission line having one end open and having a length equal to one quarter of a wavelength of the fundamental, and another transmission line having a length equal to one quarter of the wavelength of the fundamental, and having one end connected to another end of the one transmission line and another end connected to the output terminal.

5. The high frequency amplifier according to claim 1, wherein
the multiplexing circuit includes one transmission line having one end open and having a length equal to one quarter of a wavelength of the fundamental, and another transmission line having a length equal to one quarter of the wavelength of the fundamental, and having one end connected to another end of the one transmission line and another end connected to a transmission line extending between the transistor and the matching circuit.

6. The high frequency amplifier according to claim 1, wherein
the processing circuit includes another transistor configured to amplify or attenuate the harmonic extracted and a transmission line configured to shift the phase of the harmonic extracted, and
the other transistor and the transistor are identical in size.

7. The high frequency amplifier according to claim 6, wherein
the processing circuit further includes a filter provided between the extraction circuit and the other transistor, the filter being configured to remove the fundamental.

* * * * *